United States Patent
McDaniel et al.

[19]

[11] Patent Number: 6,116,915
[45] Date of Patent: Sep. 12, 2000

[54] STOP ALIGN LATERAL MODULE TO MODULE INTERCONNECT

[75] Inventors: Kent T. McDaniel, Altoona; Bradley J. Smith, Eau Claire, both of Wis.; Gregory David Spanier, Cupertino, Calif.

[73] Assignee: Cray Research, Inc., Eagan, Minn.

[21] Appl. No.: 08/927,359

[22] Filed: Sep. 9, 1997

[51] Int. Cl.⁷ .................................................. H01R 9/09
[52] U.S. Cl. .................................................. 439/65
[58] Field of Search ................................ 439/61, 67, 65; 361/785

[56] References Cited

U.S. PATENT DOCUMENTS 5,167,511  12/1992  Krajewski et al. ..................... 439/61

*Primary Examiner*—Lincoln Donovan
*Assistant Examiner*—Michael C. Zarroli
*Attorney, Agent, or Firm*—Schwegman, Lunberg, Woessnere & Kluth, P.A.

[57] ABSTRACT

An information handling system includes stacks of printed circuit boards interconnected using an interconnection system. The printed circuit boards include network boards, system interface boards, memory boards, and central processing unit boards. The interconnection system for electrically connecting the various printed circuit boards includes a set of interconnection modules placed adjacent one another to form a substantially aligned row. The interconnection modules can be used to connect one stack to an orthogonally oriented stack or to a parallel oriented stack. The printed circuit board used in the interconnection system includes an inner rail positioned near the edge of the printed circuit board, an outer rail positioned near the edge of the printed circuit board, and an alignment stop attached to or positioned near one of the inner or outer rail. The most distant interconnection module of a row of aligned modules includes a spring attached thereto. The spring biases the set of interconnection modules toward the alignment stop to lessen the amount of stack up tolerance or float between the individual modules in the aligned row of interconnection modules. Electrical contact points located between the inner and the outer rail. The modules include alignment feet which have corresponding contact points. The inner and outer rail includes slots therein for clearance of the interconnection modules with the contact points.

14 Claims, 15 Drawing Sheets

STOP ALIGN LATERAL MODULE TO MODULE INTERCONNECT

FIELD OF THE INVENTION

The present invention relates to a high density interconnect apparatus for connecting a plurality of central processing boards, a plurality of network boards, and a plurality of common memory boards in a close configuration. More particularly, the invention is directed to a system which reliably spaces and interconnects the various connections between the various boards connected by orthogonal interconnect modules.

BACKGROUND OF THE INVENTION

Very large computers or information handling systems, more commonly known as supercomputers, of the type manufactured by Cray Research, Inc., the assignee of the present invention, are constructed of a huge number of integrated circuit chips for both processing and memory. These integrated circuit chips are placed on printed circuit boards and all these printed circuit boards are interconnected closely together in order to increase the processing speed of these supercomputers. The more closely these various printed circuit boards are placed the less delay caused by the time it takes various electrical signals to pass over the conductive paths formed between the printed circuit boards. Even though electrical signals travel extremely fast at approximately one nanosecond per foot of length traveled, long electrical path lengths result in extra clocking cycles. In a supercomputer, such delays can result in noticeable performance problems.

In the past Cray Research, Inc. designed a system that provided short connection paths between printed circuit boards populated with central processing integrated circuits and printed circuit boards populated with memory integrated circuits. The prior system had a problem in that the interconnections were not made reliably. In a supercomputer, hundreds of thousands of electrical contacts must be made. Because of the shear number of connections it was difficult to get boards plugged and aligned with good contacts in the available computer checkout time. It was also difficult to replace boards in the field in an acceptable time frame. Correcting opens therefore requires a trip by service technician to locate and fix the problem.

As a result, there is a need for a supercomputer having an interconnection system that makes more reliable connections. More specifically, there is a need for an interconnection system that accurately spaces the edge connectors without limiting contact force for the contacts and also has a mechanism that eliminates any play between components. There is a further need for a supercomputer that has a high density interconnect apparatus for connecting a plurality of central processing boards, a plurality of network boards, and a plurality of common memory boards in a close configuration to improve the performance of the supercomputer.

SUMMARY OF THE INVENTION

The present invention relates primarily to the organization and physical, connection between a number of central processing (CP) boards, a number of network boards (NW), a number of system interconnect (SI) boards, and a number of common memory module (CMM) boards in a completely connected multiprocessor computer system. More particularly, the present invention describes a plurality of stacked CMM boards connected on opposing edges to a plurality of stacked NW boards which are located in planes perpendicular to those of the CMM boards. The stacked NW boards are, in turn, connected to a plurality of stacked SI boards which are located in planes perpendicular to those of the NW boards. The CMM boards and the SI boards are in substantially parallel planes. The orthogonal relationship between the CMM boards and the NW boards, and between the NW boards and the SI boards allows for a physically small package while providing a sufficient number of interconnections to allow each stack of boards to adequately access other stacks of boards in the system. A plurality of stacked CP boards are also connected to the SI boards.

An orthogonal interconnect module (OIM) connects stacks of boards located in perpendicular planes with a large number of interconnections having a short length. The distance between the boards is critical to insure that the time needed for signal travel does not inordinately limit the processing speed of the system. The OIM also includes memory metal connection devices which allow zero insertion force (ZIF) connections between the OIM and various stacks of boards. Such a zero insertion force connectors are advantageous in that boards may be easily removed as required for repairs or servicing without damaging them. The OIMs have memory metal connections controlled by heaters to allow the connections to open for removal or insertion of a board. When cooled, the memory metal connections provide an adequate force to make electrical connection between the board and connector.

The OIMs also include two flex cables which together supply 520 separate traces terminating in contact bumps to connect the boards at each end of the OIM. The maximum trace length of the preferred flex cable is less than four inches, thus providing a closely spaced short path interconnect between the interconnected boards of the preferred embodiment. In addition, individual cables can be replaced if damaged or otherwise inoperative.

Many of the boards in the supercomputer mate with several OIMs. The OIMs are aligned. The boards that mate with OIMs are provided an inner rail and an outer rail along or near the edge of the board to which the OIMs connect. The inner and outer rails guide the OIMs to the board and prevent damage of the OIM contacts by preventing them from contacting the board until they are aligned. One of the inner rails on the board, includes a stop at one end. The stop is precisely positioned with respect to the electrical contact points on the board and provides for precise positioning of the contact bumps of the OIM to the board. The contact points of the OIM are spaced through attachment to plastic feet. The feet are sized to align the contact points of the flex to the board pads when the feet are tightly spaced to each other and the last foot contacts the stop on the inner rail. Since several OIMs mate to one board edge a bias element is provided at the other end opposite the stop to remove unacceptable float between the OIMs and bring the contact points of the OIM into alignment with the contacts along the edge of the board to which the OIM is attached.

The resulting supercomputer has a more reliable interconnection system that results in a more reliable supercomputer. The rails and the alignment stop accurately space the contact pads of the OIM edge connectors with the contacts of the board to which the OIMs connect. The bias element eliminates a selected amount of play between OIMs so that stack up tolerances do not result in a misalignment between the contact pads of the OIM edge connectors with the contacts of the board to which the OIMs connect. Since such stack up tolerances do not exist, excessive "opens" are eliminated. The supercomputer with the inner and outer rails enhances the high density interconnect apparatus for connecting a plurality of central processing boards, a plurality of network boards, and a plurality of common memory boards in a close configuration to improve the performance of the supercomputer.

DESCRIPTION OF THE PREFERRED EMBODIMENT

In the following detailed description of the preferred embodiments, reference is made to the accompanying drawings which form a part hereof, and which illustrate specific embodiments for practicing the invention. It is to be understood that other embodiments may be utilized and structural changes may be made without departing from the scope of the present invention.

Figure 1:
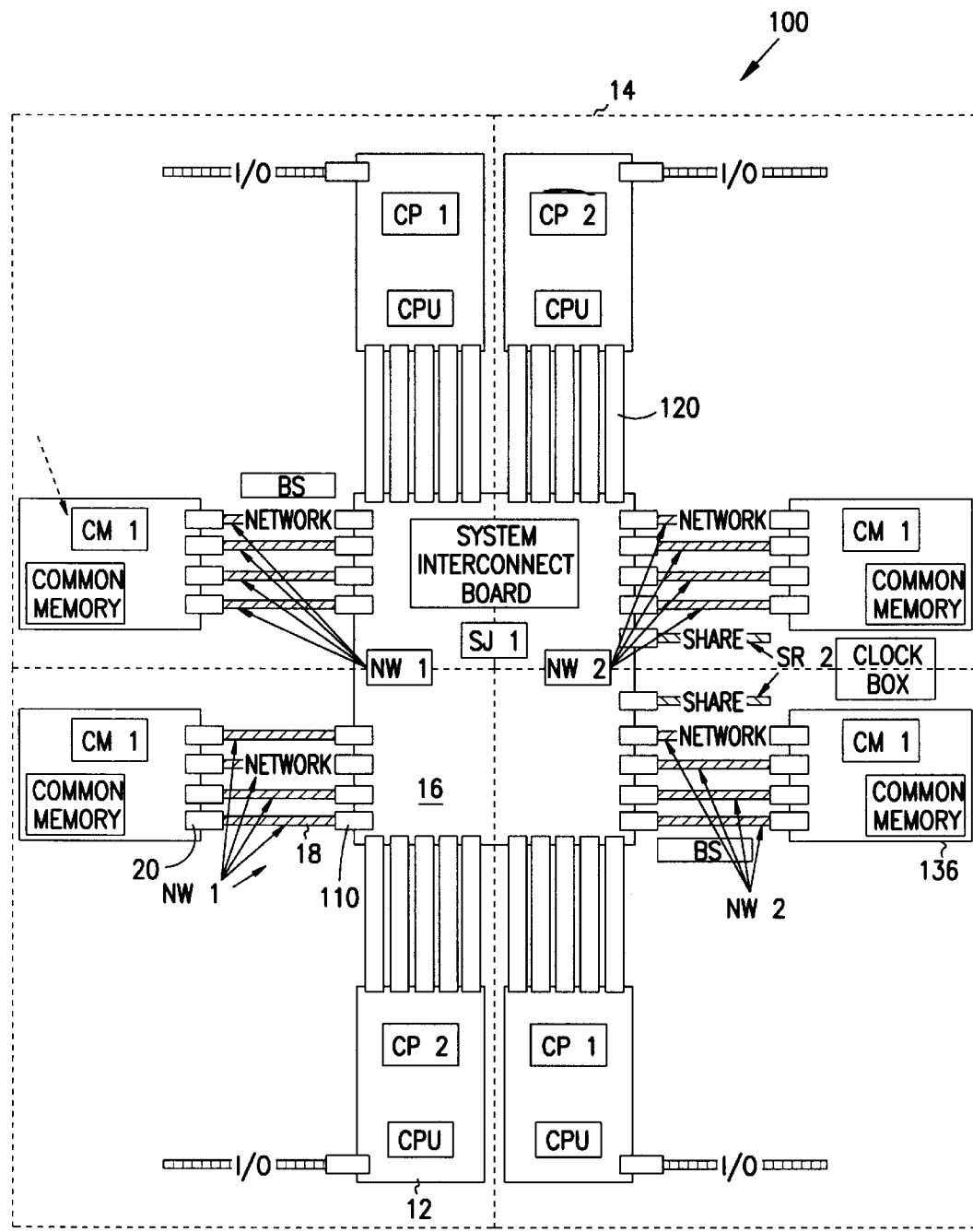
FIG. 1 is a top view of supercomputer having first configuration of a plurality of CMM, CP, NW and SI boards.

FIG. 1 is a top view of an information handling system in the supercomputer 100 category having a first configuration of a number of central processing (CP) boards 12, a number of network boards (NW) 18, a number of system interconnect (SI) boards 16, and a number of common memory module (CMM) boards 14 in a completely connected multiprocessor computer system. The a plurality of CMM, CP, NW and SI boards. The stack of a plurality of system interconnect (SI) boards 16 are in the center of the system. A number of central processing (CP) boards 12 are connected to at least one set of edges of the stack of the system interconnect (SI) boards 16. A number of network (NW) boards 18 are connected to at least one set of edges of the stack of the system interconnect (SI) boards 16. A number of common memory module (CMM) boards 14 are in turn connected to the network (NW) boards 18. A plurality of interconnection modules 110 are used to interconnect the various stacks of boards. The interconnection modules include orthogonal interconnect modules (OIM) 20 for connecting a first stack in an orthogonal relation to a second stack and parallel interconnect modules (PIM) 120 for connecting a first stack of boards in parallel planes to the planes of the boards in the second stack of modules.

Figure 2:
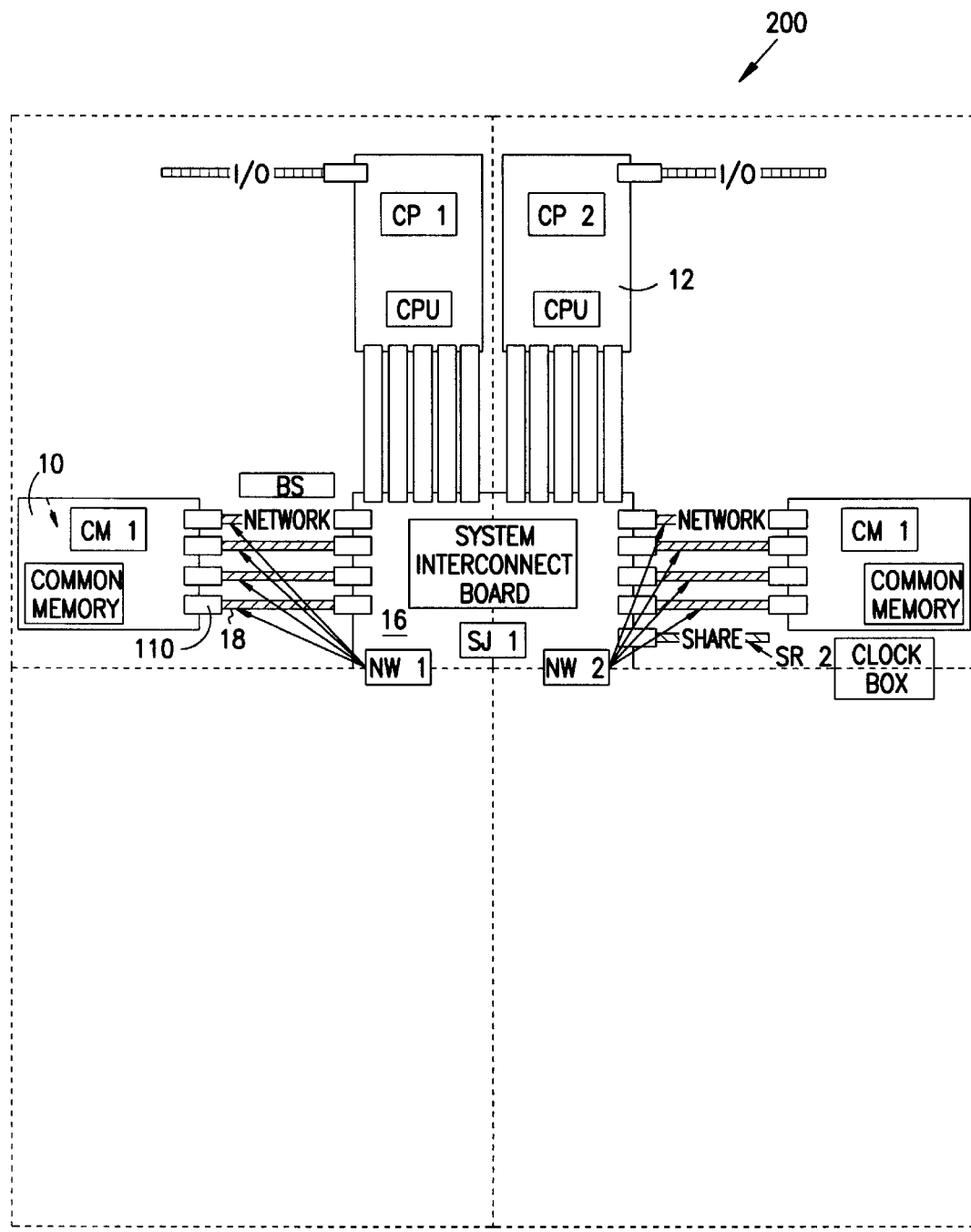
FIG. 2 is a top view of supercomputer having a second configuration of a plurality of CMM, CP, NW and SI boards.

FIG. 2 is a top view of supercomputer 200 having a second configuration of a number of central processing (CP) boards 12, a number of network boards (NW) 18, a number of system interconnect (SI) boards 16, and a number of common memory module (CMM) boards 14 in a completely connected multiprocessor computer system. The second configuration associated with supercomputer 200 is actually a portion of the first configuration associated with the supercomputer 100. The supercomputer 100 can actually be divided into quadrants. The second supercomputer 200 is comprised of two quadrants of the supercomputer 100. Like supercomputer 100, a plurality of interconnection modules 110 are used to interconnect the various stacks of boards. The interconnection modules include orthogonal interconnect modules (OIM) 20 for connecting a first stack in an orthogonal relation to a second stack and parallel interconnect modules (PIM) 120 for connecting a first stack of boards in parallel planes to the planes of the boards in the second stack of modules.

Orthogonal Interconnect Module Array

Figure 3:
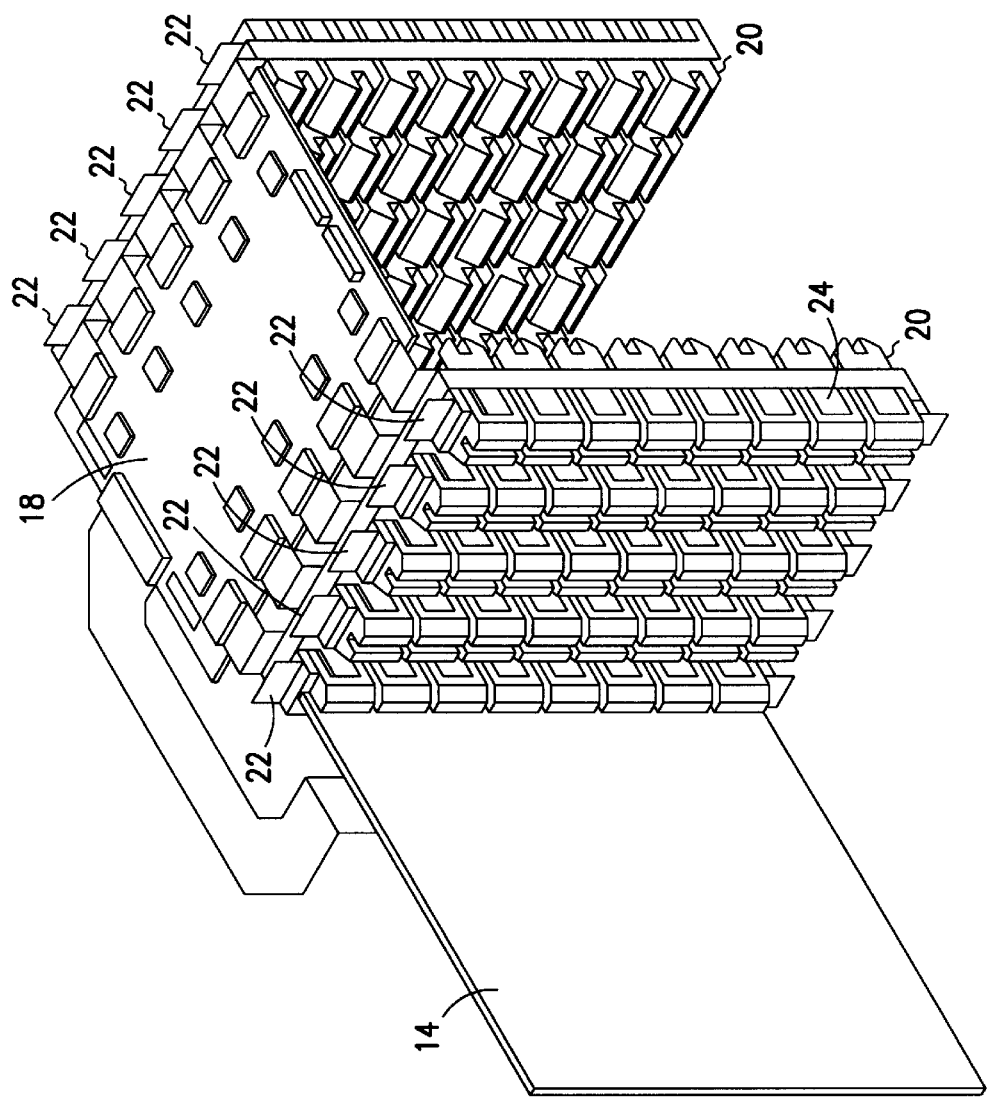
FIG. 3 is a perspective view of the array of orthogonal interconnect modules shown as connected to one of the CMM boards units.

An overall system view of an embodiment of the orthogonal interconnect module (OIM) array is shown in FIG. 3 where one of the NW boards 18 is connected to each of the stacked CMM boards 14 (not shown in FIG. 3) on one side and to five SI boards (not shown in FIG. 3) on another side by an OIM 20. This configuration will be described in detail here. It should be understood that this invention is equally applicable to a parallel interconnect module (PIM) which attaches the CP boards to the SI boards in the supercomputer or information handling system shown in FIG. 1. Each column of OIMs 20 is located on a T-shaped channel 22 which is used to precisely locate each OIM 20 and prevent it from moving in the system. In the preferred embodiment, the OIMs 20 are located on centers approximately 1.28" apart along the T-shaped channel 22.

Figure 4:
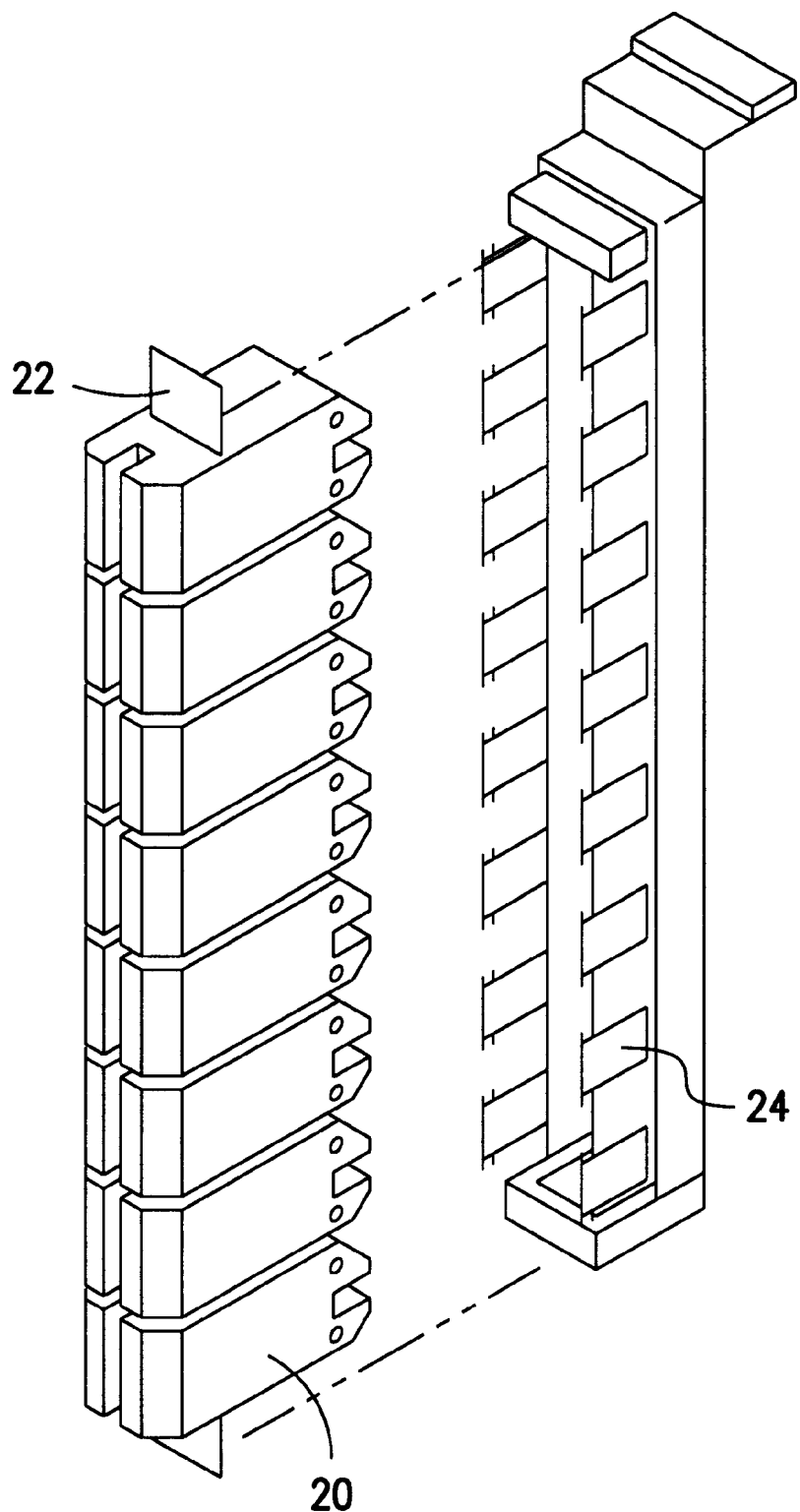
FIG. 4 is an assembly view of one column of orthogonal interconnect modules and associated T-beam and heater power supply structure.

FIG. 4 is an assembly view of one column of orthogonal interconnect modules and associated T-beam and heater power supply structure. In addition to the T-shaped channel 22, each OIM column is also attached to an electronic heater connection strip 24 as shown in FIG. 4. This strip 24 connects each orthogonal interconnect module's heaters 46 to power supplies (not shown) to allow the OIMs 20 to be opened as required. Supply power to the orthogonal interconnect module (OIM) 20 causes it to open and release the edge of a board attached thereto. Power is distributed to the heating elements 46 of the OIMs 20 by a power distribution board.

Orthogonal Interconnect Module

Figure 5:
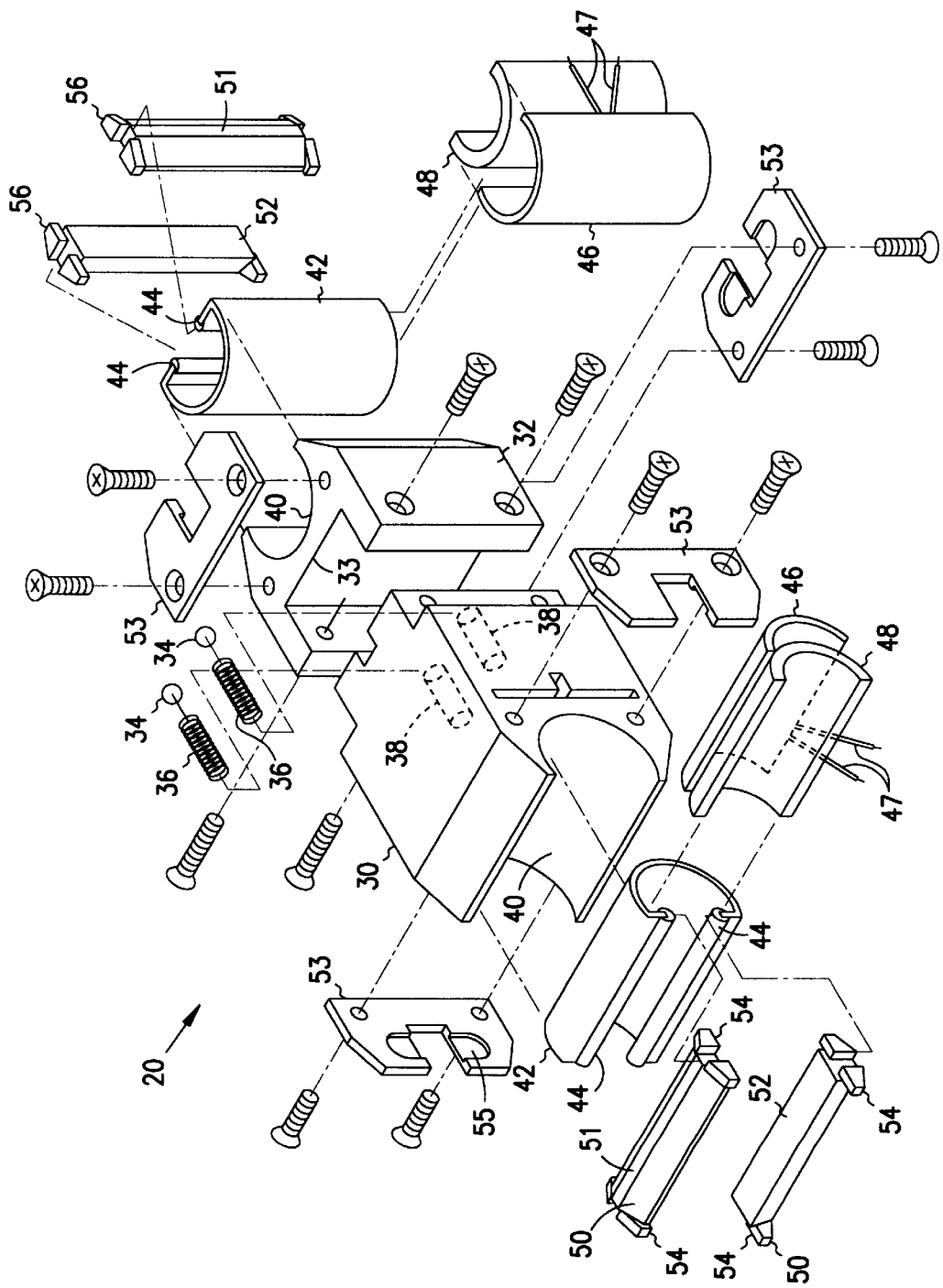
FIG. 5 is an exploded assembly view of an orthogonal interconnect module without flex cables.
Figure 6:
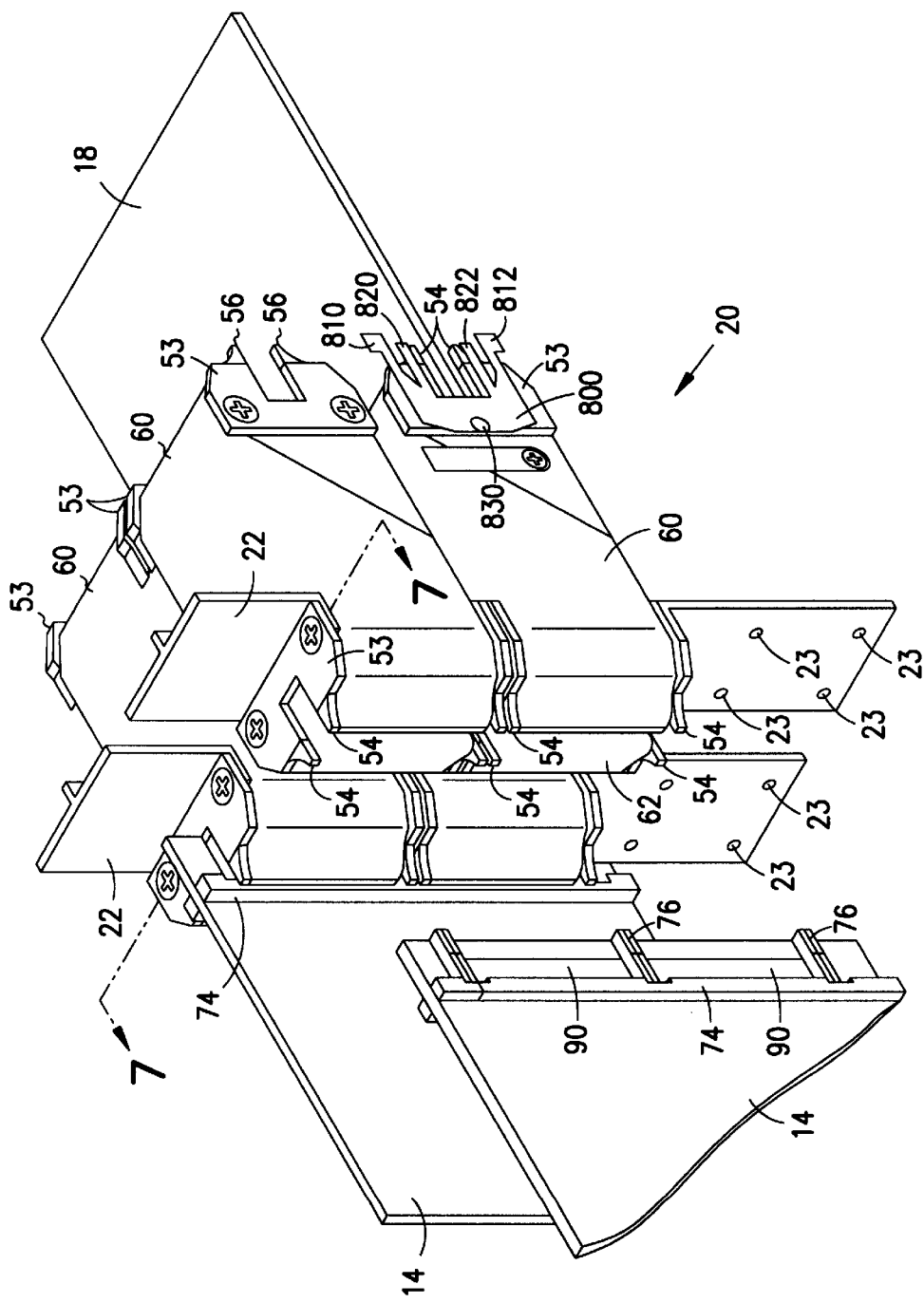
FIG. 6 is a perspective view of four orthogonal interconnect modules in the process of attachment to network boards and common memory boards.
Figure 7:
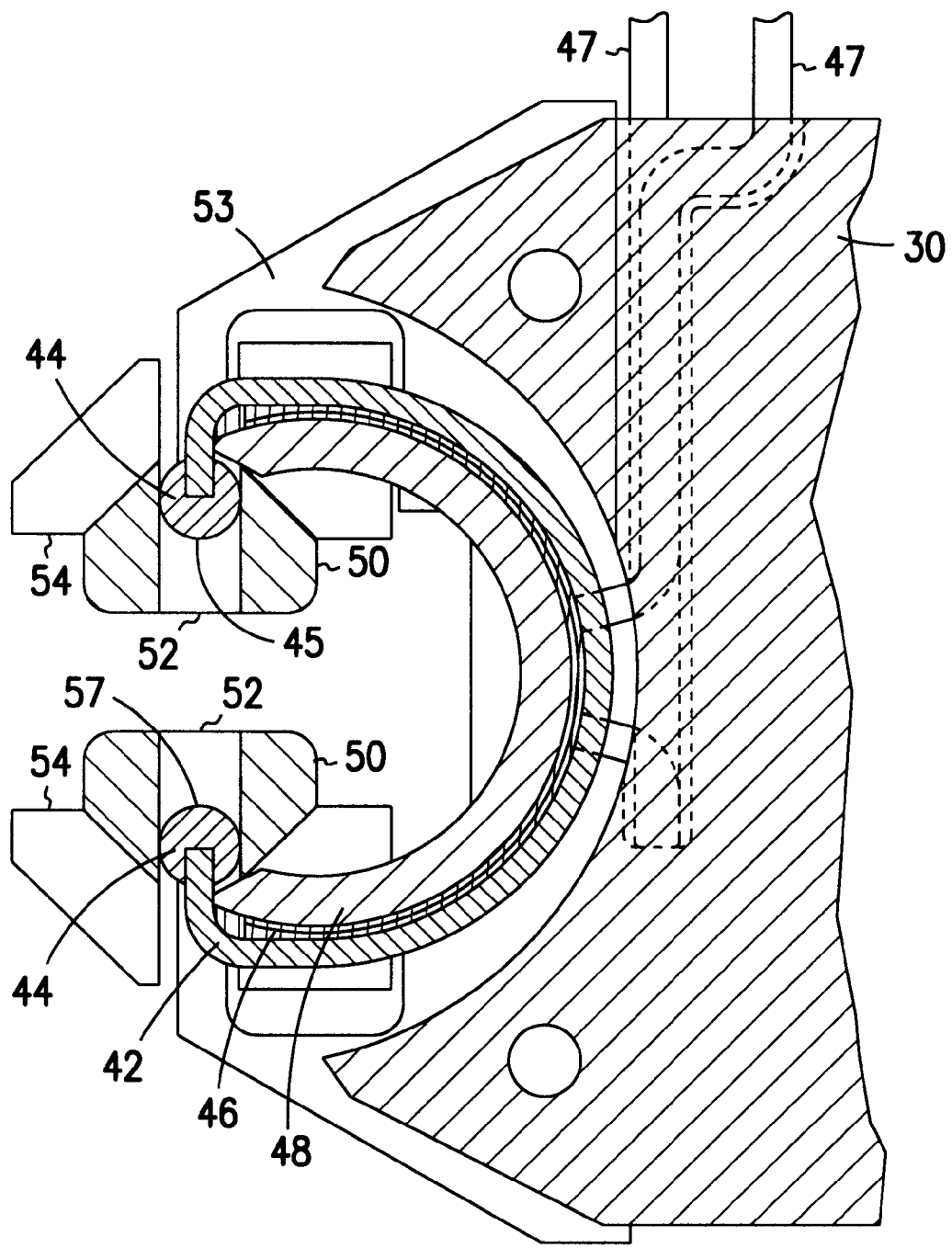
FIG. 7 is a cross-section of one end of an orthogonal interconnect module.

Referring to FIGS. 5–7, the preferred embodiment of the orthogonal interconnect module (OIM) 20 consists of a connector body with openings 40 disposed on either end but lying in orthogonal planes. The preferred OIM has a cross-section approximately 1.1" square with an overall length of approximately 2.4". The contact pressure pads 50 on both ends of the preferred OIM are located approximately 2.05" apart, center to center.

In the preferred embodiment, the body of the OIM is formed of a cap 32 and head piece 30, both preferably of non-glass filled polyetheretherketone (PEEK), which are formed to nest together. In an alternate preferred embodiment, the cap 32 and head piece 30 could be formed of a liquid crystal polymer (LCP). A T-shaped slot 33 to receive the T-shaped channel 22 is formed at the junction of the cap 30 and head piece 32. That slot 33 allows the modules 20 to be located on the T-shaped rails 22 within the computer assembly 10.

The head piece 30 preferably contains two bores 38 formed in it, each of which contain a coil spring 36 and ball bearing 34. When the cap 32 and head piece 30 are assembled, the balls 34 and springs 36 are kept within the head piece 30 by the cap 32, with the balls 34 partially protruding into the T-shaped slot 33. The balls 34 are sized to cooperate with bores 23 formed in the T-shaped channel 22 to accurately locate the modules 20 along the channel 22 at predetermined locations defined by the bores 23. Alternately, the connector body could be formed of a single piece of metal or other material and located by means other than balls and springs, variations of which will be recognized by those skilled in the art.

Each opening 40 on the ends of the preferred embodiment OIM 20 contains the means required to grasp the edge of a selected printed circuit board. such as a CP board 12, CMM board 14, NW board 18 or SI board 16. In the preferred embodiment, the springs 42,48; contact pressure pads 50; and OIM flex cable contact bumps 66 (see FIGS. 9 and 10) cooperate to result in a normal force of a minimum of 60 grams between each flex cable contact bump 66 and associated connection pad on or near the edge of a printed circuit board. When open, the distance between the opposing flex cable contact bumps 66 of the preferred OIM 20 is a minimum of 0.02" wider than the maximum assembled CP board 12, CMM board 14, SI board 16 or NW board 18 thickness. As the basic construction of either end of the OIM 20 is similar, only one of the ends will be described in detail below.

The cross section of FIG. 7 shows heater leads 47 on location of channel 49 and formed within the module body opposite the cross-section line. The heater leads 47 connect the heaters 46 located in the opening with an electrical power source (not shown). In the preferred embodiment of the OIM 20, each opening 40 contains two heaters 46 although only one heater is used in normal operation, with the second heater operating as a backup to protect against failure of the first heating element. The preferred heaters 46 are of a resistance type operating on principles well-known to those in the industry and, therefore, will not be described further. The actuation cycle required to activate the memory metal spring 48 to open the OIM 20 is 2.5 amps for 15 seconds in an ambient temperature of 25 degrees Centigrade. The preferred heater 46 requires 10 watts per inch of length and reaches a temperature of 95 degrees Centigrade.

In the preferred embodiment, a connector spring 42 is nested in the circular opening of the module 20. The connector spring 42 is preferably formed primarily of a beryllium copper alloy which is chosen for its spring characteristics. Two ends of the connector spring have a rounded edge bar 44 soldered or otherwise attached to the connector spring 42. The rounded edge bars 44 are formed of brass in the preferred embodiment.

Figure 9:
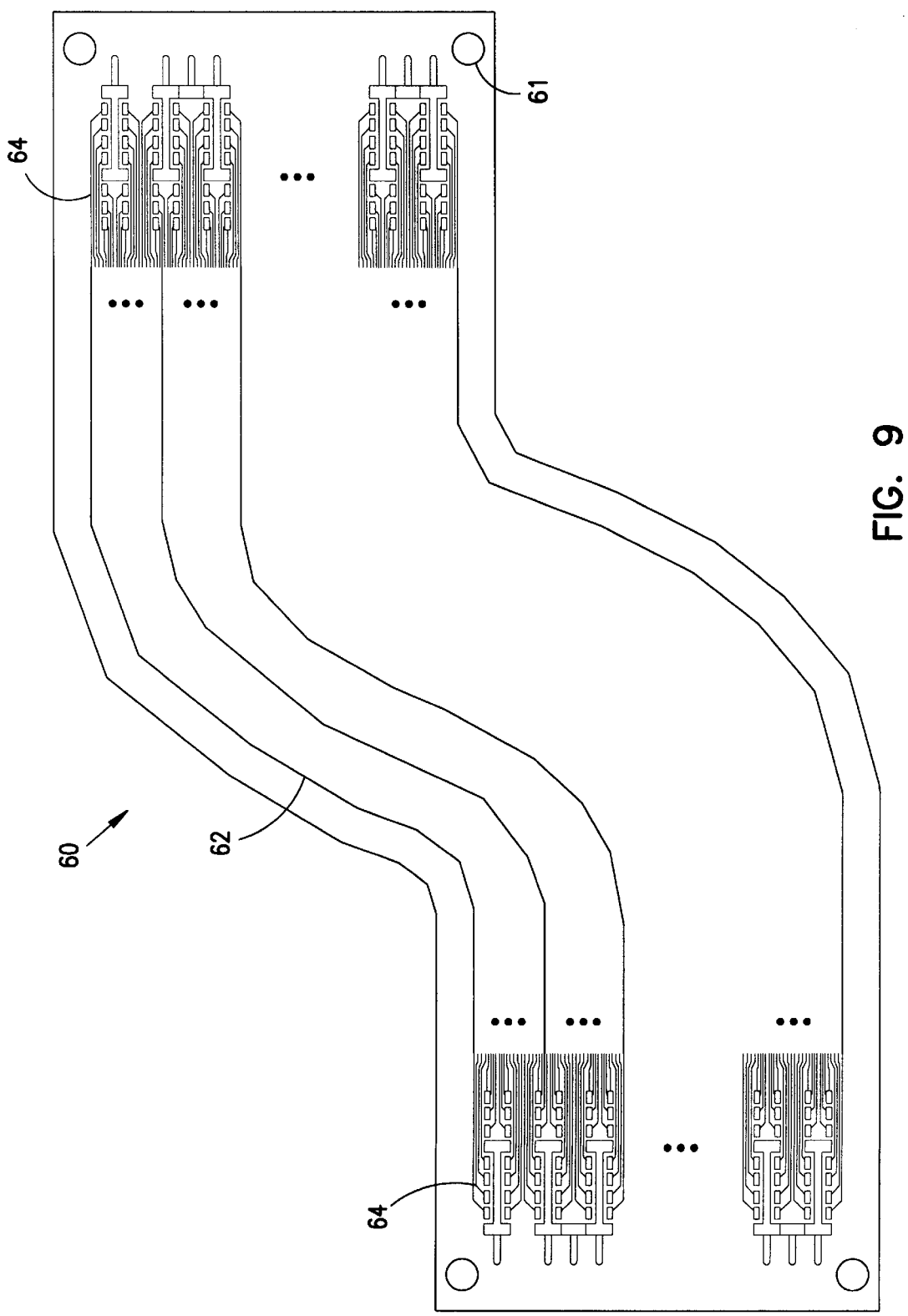
FIG. 9 is a top view of the flexible circuit used in the orthogonal interconnect module of FIGS. 5 and 6.

In the preferred embodiment, the contact pressure pads 50 have grooves 45 in which the rounded edge bars 44 of the connector spring 42 ride. Each contact pressure pad 50 is preferably formed of LCP 30% glass fill and the groove 45 is preferably finished to prevent the bars 44 from binding in the groove 45. Also as shown in FIG. 9, the grooves 45 are also chamfered 57 to provide uniform pressure across the contact pressure pad 50 face 52. The chamfers 57 are preferably formed at a 36.5° angle to the face 52. In the preferred embodiment, the part 50 is molded to obtain a smooth finish.

Nested within the connector spring 42 of the preferred embodiment are heaters 46 and a memory metal spring 48 used to force the connector spring 42 open, thereby moving the contact pressure pads 50 apart. When heated by the heaters 46, the memory metal spring 48 attempts to straighten or flatten itself out which tends to open the connector spring 42.

The memory metal spring 48 used in the OIMs 20 of the preferred embodiment is given a flattened shape in the austenitic phase above the forming temperature. The memory metal spring 48 is formed into a curled shape while in the martensitic phase and is maintained in the martensitic phase below the austenitic transformation temperature when the OIM 20 is closed on a circuit board. In use, the memory metal spring 48 is curled and reforms to its flattened shape when heated to its austenitic phase. After use, as the spring 48 cools into its martensitic region, it curls into its desired semi-circular shape. The flattened shape can again be recovered when the memory metal of the spring 48 is heated into its austenitic region.

When the OIM 20 of the preferred embodiment is to be opened to remove a circuit board, the heaters 46 located next to the memory metal spring 48 are activated to warm the spring above the transition temperature so that the alloy of the spring 48 enters the austenitic phase. In the austenitic phase, the memory metal spring 48 attempts to reestablish its flattened shape which opens the connector spring 42, moving the contact pressure pads 50 of the OIM 20 away from each other, thereby allowing a circuit board to be removed without damage.

After a circuit board is replaced, the heater 46 is turned off, allowing the memory metal spring 48 to cool back to its martensitic phase. While cooling, the memory metal spring 48 returns to its curled shape which allows the connector spring 42 to move the contact pressure pads 50 and associated OIM flex cable contacts 66 together and into connection with associated contacts on a circuit board.

The unusual behavior of the memory metal spring 48 is called the shape-memory effect. Shape-memory behavior is connected with thermoelastic austenitic transformation. The preferred embodiment of the present invention uses the shape memory effect of the memory metal alloys. The use of memory metal in electronic connectors is also disclosed in U.S. Pat. No. 4,621,882 to Krumme, issued on Nov. 11, 1989, which is incorporated herein by reference.

The memory metal used for the spring 48 in the preferred embodiment of the present invention is a nickel-titanium alloy which is sometimes referred to as Nitinol. Although in the preferred embodiment of the present invention, Nitinol alloys are described as the best mode of practicing the invention, those skilled in the art will also readily recognize that a wide variety of shape memory metals having superelastic qualities could be substituted therefor. Shape memory behavior is found in a variety of alloys such as Ni—Ti, Ag—Zn, Au—Cd, Au—Cu—Zn, Cu—Al, Cu—Al—Ni, Cu—Au—Zn, Cu—Sn, Cu—Zn, Cu—Zn—Al, Cu—Zn—Ga, Cu—Zn—Si, Cu—Zn—Sn, Fe—Pt, In—Tl, Ni—Al, Ni—Ti, Ni—Ti—X (where X is a ternary element), Ti—Co—Ni, Ti—Cu—Ni and others. In the preferred embodiment, nickel-titanium (Nitinol) alloys are used with the specific composition of the alloys selected so that the transition temperature remains well below the ambient operating temperature of the electronic assembly.

To contain the connector spring 42, memory metal spring 48, heaters 46 and contact pressure pads 50 within the opening 40 of the OIM 20, the assembly includes keeper plates 53 attached to each side of the opening. The plates 53, preferably LCP, are shaped to contain the springs 42,48 and contact pressure pads 50 in the proper relationship to the opening 40 of the OIM 20.

Although a memory metal spring 48 and heater 46 assembly is shown in the preferred embodiment of the OIM 20, it will be appreciated by those skilled in the art that a number of other variations could be used to open and close the contact pressure pads 50, including mechanical or electromechanical means.

Spring Mechanism

Figure 8:
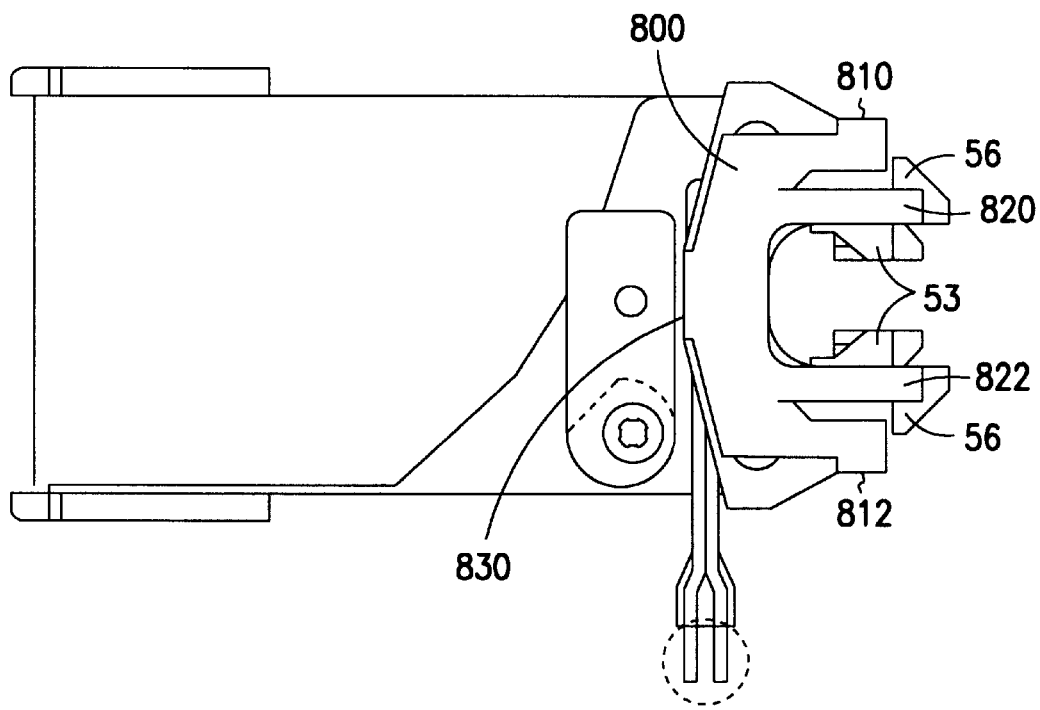
FIG. 8 is a side view of a interconnect module showing the spring mechanism.

Now turning to FIGS. 6 and 8, the spring element 800 will be detailed. The spring element 800 is attached to the side of an OIM 20. The spring element 800 is attached to the OIM on one end of a stack of OIMs 20. The spring element 800 places a sideways load on the placement feet 56 of all of the OIMs 20 in a stack or row of OIMs. The spring element 800 pushes the stack toward an alignment stop on a printed circuit board when the printed circuit board 18 is placed within the row of OIMs 20. The spring is snap fit onto the keeper plate 53 using tabs at 830, 810 and 812. The spring element 800 also has two cantilevered leaf springs 820 and 822 which press up against the alignment feet 56 of the OIM. The alignment feet 56 of the stack of OIMs 20 typically has some "float" therein. The application of the biasing force by the leaf springs 820 and 822 minimizes or eliminates the float between the various sets of alignment feet 56 of the OIMs 20. When the float is eliminated amongst the alignment feet 56 of the OIMs 20, the contact pads associated with the OIM are more accurately aligned with the pads 82 which contain individual contacts 83.

OIM Flex Cable

Figure 10:
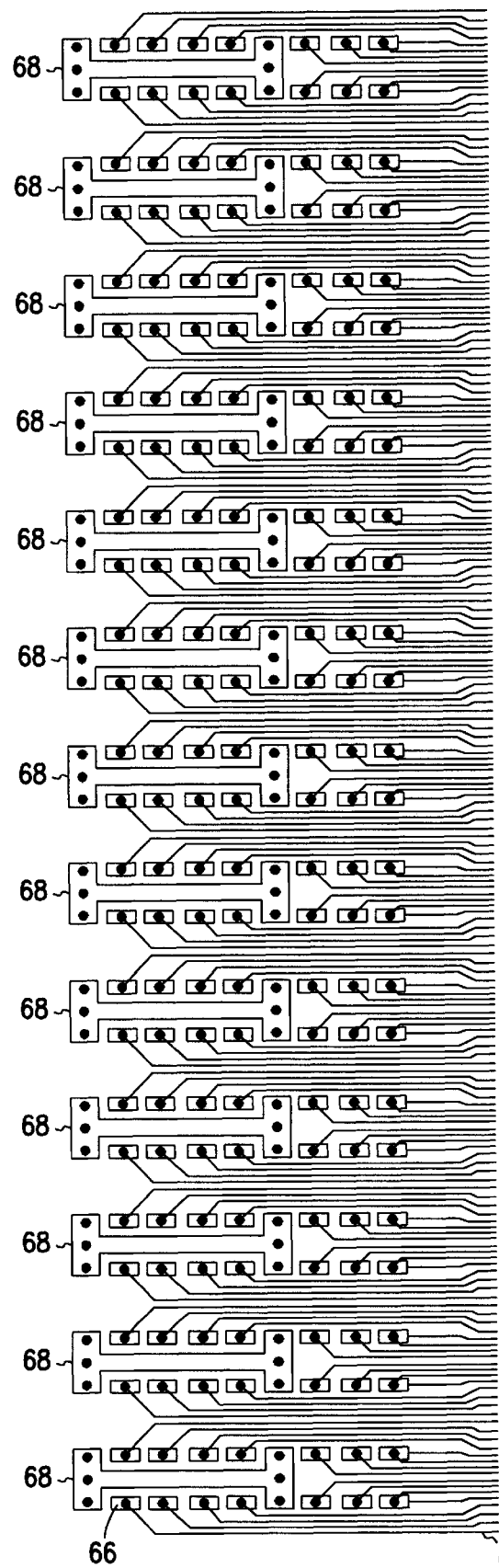
FIG. 10 is a top view of the interconnect pattern on each end of the flexible circuit of FIG. 9.

To make the electrical connections between the boards connected by the OIM 20, its preferred embodiment includes two flex cables 60 as shown in FIG. 6. The flex cables 60 are adapted to be routed along opposite sides of the connector 20. The OIM flex cable 60 as shown in FIGS. 9 and 10 is provided with registration marks 61 in order to align the contact bumps 66 of the OIM flex cable 60 on the contact pressure pad faces 52 so that accurate connections can be made with the corresponding connection pads located on either the CP 12 or CMM boards 14. After the cable 60 is attached to the contact pressure pad faces 52, the registration marks are trimmed away along with any additional excess material from the flex cables 60.

When in location, the flex cable interconnect areas 64 are located on the faces 52 of the OIM contact pressure pads 50. In the preferred embodiment, the flex cables 60 are attached to the faces 52 of the contact pressure pads 50 with an epoxy-based adhesive and elastomer (not shown). The flexibility of the cable 60 and elastomer allows the contact pressure pads 50 to be opened and closed as required without adversely affecting the electrical integrity of the cable 60.

The OIM flex cable 60 of the preferred embodiment is shown in FIG. 9 before attachment to the OIM 20. The flex cable 60 is preferably approximately 1.1" wide and approximately 3.3" long (as measured in a straight line from end to end). The trace lines 62 of the flex cable 60 follow the substantially rounded curves of the flex cable 60 to prevent any unwanted electrical problems due to sharp bends in the flex cable 60. The minimum trace length from one end of the preferred flex cable 60 to the other end is preferably approximately 3.65 inches with the maximum trace length being approximately 3.99 inches.

The OIM flex cable 60 preferably contains 208 trace lines split between the top and bottom surface and separated by a continuous ground layer (not shown). FIGS. 9 and 10 show an alternate configuration where all the signals are carried on one layer. The traces 62 are formed by standard photolithography methods, using either positive or negative photoresist and masks, in conjunction with electrolytic metal coating to form the traces 62, ground layer and connection bumps 66 on the flex cable 60.

The flex cable base is a flexible organic material (trade name: KAPTON Registered TM ) having a thickness of 0.001 inches. The traces 62 are formed of copper approximately 0.0005 inches thick with a maximum DC resistance of 1.0 ohms per inch. The traces 62 have a width of approximately 0.002 inches on centers spaced 0.010 inches apart. The ground layer is also preferably formed of copper approximately 0.0005 inches thick. The cables 60 are also preferably coated on both sides with a polyamide layer and associated adhesive which is no more than 0.001 inches thick per side, the purpose of which is to protect both the traces 62.

Each end of the OIM flex cable 60 contains a pattern 64 of contact bumps 66, each of which are electrically connected to the end of a trace line 62. An enlarged view of the contact bump pattern 64 is shown on FIG. 12. The contact bump pattern 64 as shown, is the same on each end of the OIM flex cable 60.

The preferred contact bump pattern 64 comprises an area approximately 1"x0.180" with the contacts 66 forming twenty-six columns and ten rows, resulting in 260 contacts 66 at each end of the flex cable 60. The columns are spaced on 0.040" centers and the rows are spaced on 0.020" centers. The contact bumps 66 of the preferred embodiment are approximately 0.0060" wide x0.0010" long and extend 0.0015–0.0035 inches above each trace 62.

In the preferred embodiment, the contact bumps 66 are preferably electrolytically deposited on the ends of the flex cable traces 62 in conjunction with standard photolithography techniques using either positive or negative photoresist and the appropriate masks. The preferred bump 66 has layers including a copper base layer, copper trace layer, copper bump, nickel plate and a gold plated top layer. The contact bumps 66 are preferably planar to within +/−0.0002 inches within any one of the thirteen individual contact matrices 68 (each matrix containing two columns of ten contacts 66) as shown in FIG. 10.

In the preferred system, the traces 62 are used to send electronic signals in one direction with the copper ground layer (not shown) located between the trace layers operating as the ground for the electronic signals. An alternate embodiment of the OIM flex cable 60 can be constructed without the ground layer opposite the trace side, for systems in which pairs of traces 62 and associated contact bumps 66 are used to send and receive signals through the flex cable 60. Emitter Coupled Logic (ECL) and other similar uses requiring such paired signals will be known to those skilled in the art and will not be described further herein.

Although the traces 62, ground plane and contact bumps 66 of the preferred embodiment are formed of copper, nickel and gold, those skilled in the art will understand that other conductive materials could be used as well. Additionally, although the metals are electrolytically deposited on the flex cable 60, it will be readily understood by those in the art that metals or other conductive materials could be formed on the flex cable 60 by sputtering or a variety of other methods. Alternately, the electrically conductive patterns could be etched from a single layer of material rather than deposited on the flex cable 60 in layers.

OIM Alignment Mechanism

The contact pressure pads 50 of the preferred OIM 20 also have alignment feet 54,56. The feet 54,56 are constructed to cooperate with slots 72,76 in alignment rails 70,74 on the NW boards 18 and CMM boards 14. The feet 54 accurately align to slot 76 on the CMM board 14 to align the dense contact bump patterns 64 on the flex cable 60 with the corresponding pads 90. Feet 56 allow clearance to slot 72 on the NW board 18 to allow full force delivery of the bumps 64 to the pads 82 on the NW board 18. Alignment of the bump 64 to the pad 82 in the edgewise (0.040" axis) is accomplished by aligning the feet 56 to the rail stop feature 1110 and stacking the feet 56, which are of the same length as the pad matrix 82, to each other using the spring 800 located on the bottom OIM 20 to insure there is no float between the feet 56.

The alignment feet 54,56 located on the contact pressure pads 50 of the OIM 20, are of two basic designs. The alignment feet 56 required on the contact pressure pads 50 which cooperate with the preferred board rails 70 are adapted to allow the NW boards 18 to slide across a row of OIMs 20, as shown in FIG. 6 and will be described first. The alignment feet 56 to cooperate with the slots 72 in the alignment rails 70 and 73.

Typical Printed Circuit Boards

Figure 11:
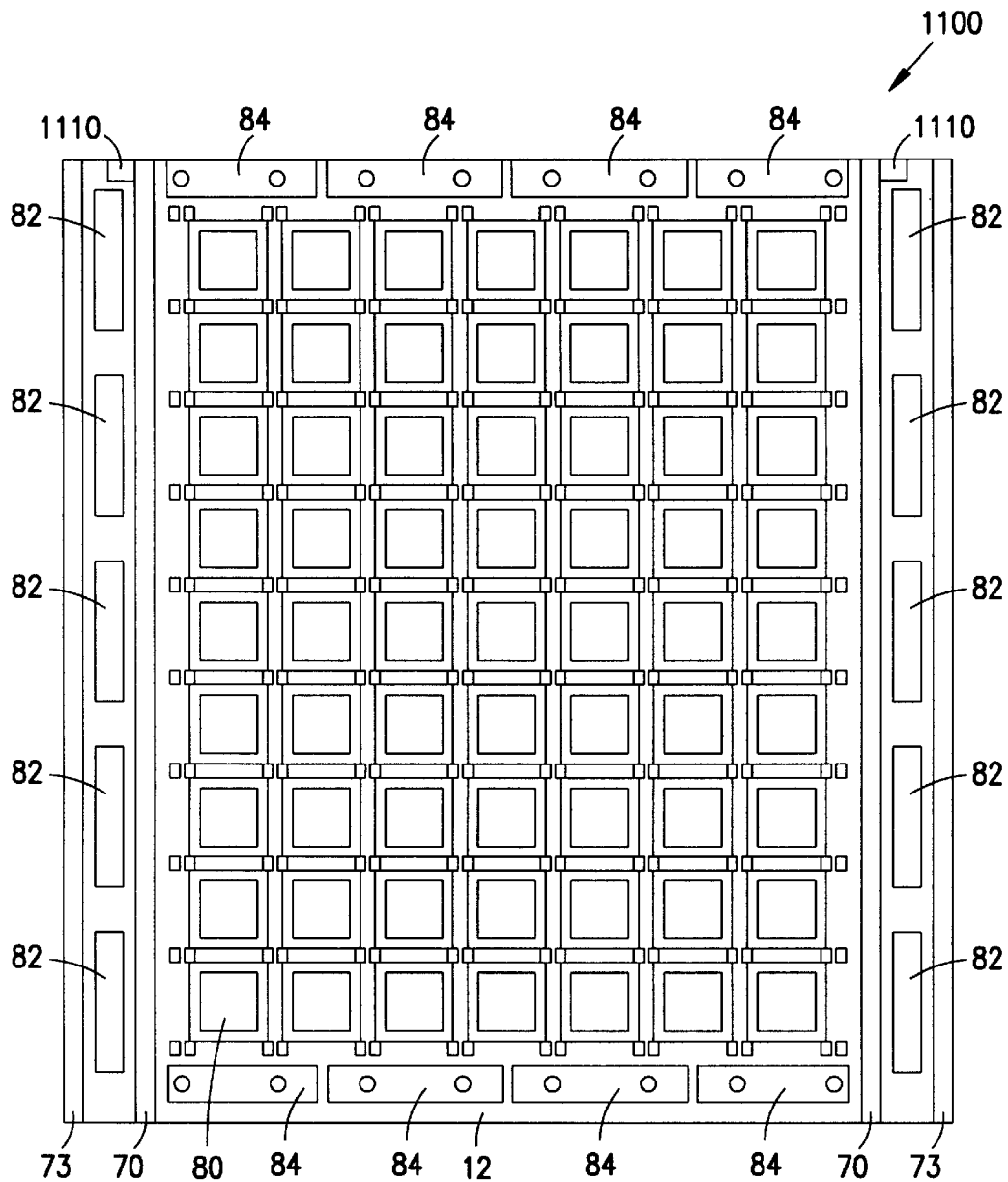
FIG. 11 is a view of a typical board 1100 showing the alignment rails, interconnection pads, power pads, and integrated circuit chip assemblies.

FIG. 11 shows a typical printed circuit 1100 for use in the interconnection system of the supercomputer 100 or supercomputer 200. The board 1100 contains a number of OIM connection pads 82. The pads 82 are distributed such that five OIM connection pads 82 are located on each of two opposing edges on each of the two major surfaces of the board 1100. Of course, the specific number of pads 82 can vary depending on the application and the height of the stack of OIMs for a particular design. On each edge of the board are an inner rail 70 and an outer rail 73. The inner and outer rail can also be thought of as pairs of alignment rails 70,73 surrounding the connection pads 82. On the remaining two opposing edges of the board 1100 are pads 84. Pads 84 are used for any of a number of purposes, including connecting power to the boards 1100, for clock distribution, Input/Output (I/O) translators, interprocessor communications or a variety of other system components.

The OIM connection pads 82 are located on 1.28" centers along the edges of the board 1100. Each pad 82 contains a number of individual electrical contacts placed in an array. In the particular embodiment, the contact pads 83 are located in an array, having twenty-six columns and ten rows. The contact pads 83 connect to a similar array of contact bumps 66 on the flex cables 60 of the OIMs 20. Each column of pads 83 is located on 0.040" centers and each row is spaced on 0.020" centers. Each pad 83 is approximately 0.0150" wide ×0.0350" long, resulting in a total OIM connection pad 82 area measuring approximately 1.0×0.18". The OIM connection pad 82 is precisely placed with respect to the alignment rails 70,73 such that when the alignment feet 56 of the OIM 20 are in alignment between the alignment of rails 70, 73, the contact bumps 66 of each flex cable 60 align with the corresponding contact pads 83 of the OIM connection pad 82 in the 0.020" axis.

In the preferred embodiment, the board 1100 contact pads 83 are preferably electrolytically deposited on the boards 1100 in conjunction with standard photolithography techniques using either positive or negative photoresist and the appropriate masks. The pads 83 can be precisely placed using photolithography techniques. The preferred pad 83 includes a copper base layer, nickel plate layer and a gold plated top layer. Although the contact pads 83 of the preferred embodiment are formed of copper, nickel and gold, other conductive materials could be used as well. Additionally, although the metals are electrolytically deposited on the board, it will be readily understood by those in the art that metals or other conductive materials could be formed on the board 1100 with the required precision by sputtering or a variety of other methods. Alternately, the electrically conductive patterns could be etched from a single layer of material rather than deposited on the board 1100 in layers.

On one end of the rails 70 and 73 is a stop 1110 used for edgewise, 0.040 axis, alignment. The stop 1110 is precisely placed. The spring 800 forces the alignment feet 56 into engagement with the stop 1110 on one end and also forces the alignment feet into contact with one another to assure that any "float" is taken out from between the alignment feet of the individual interconnect modules 20 of the aligned row or stack of OIMs. This provides for accurate placement of the contact pads of the interconnect modules 20 with the individual pads 83 in the connection pad 82 area.

The Inner and Outer Rails

Figure 12:
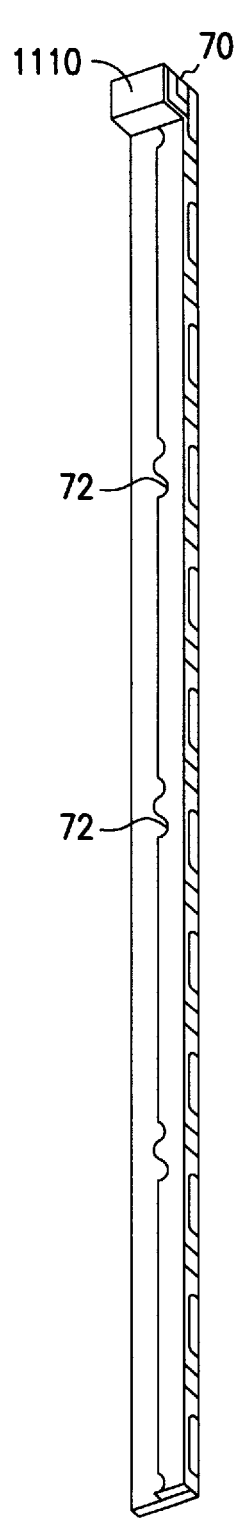
FIG. 12 is a perspective view of the inner rail of a typical board 1100.
Figure 13:
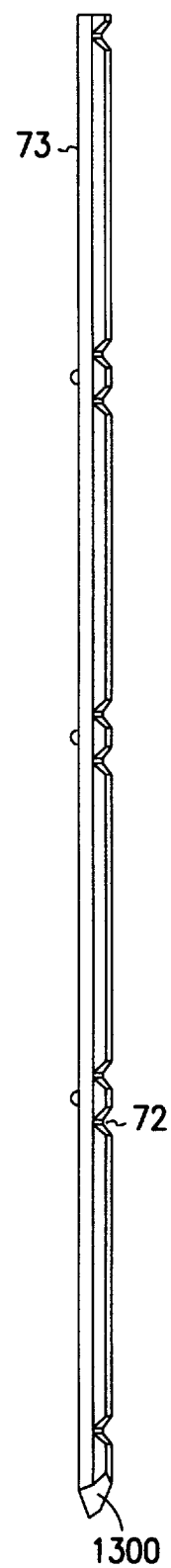
FIG. 13 is a perspective view of the outer rail of a typical board 1100.

FIG. 12 is a perspective view of an inner rail on the typical board 1100. FIG. 13 is a view of an outer rail 73 that is also located on a typical board 1100. The rails 70 and 73 enclose the connection areas 82. Each of the rails includes a set of slots 72 which allow the alignment feet 56 of the OIMs 20 to not limit force to the contacts 66. The inner 70 and outer 73 rails also prevent contact 66 damage by holding the feet 56 of the board pads 82 as the board 1100 slides past the OIMs 20. The rails 70 and 73 also have a beveled end, shown on outer rail 73 as surface 1300, to lead the aligned OIMs 20 onto the board 1100 without damaging the contacts 66. The inner rail includes a stop 1110. As shown, the stop is positioned orthogonal to the main body of the rail 70. The inner rail stop 1110 aligns the OIMs 20 in the 0.040" edgewise axis. The alignment of the inner 70 to outer 73 rail to the board pads 82 insures alignment in the opposite 0.020" axis.

Figure 14:
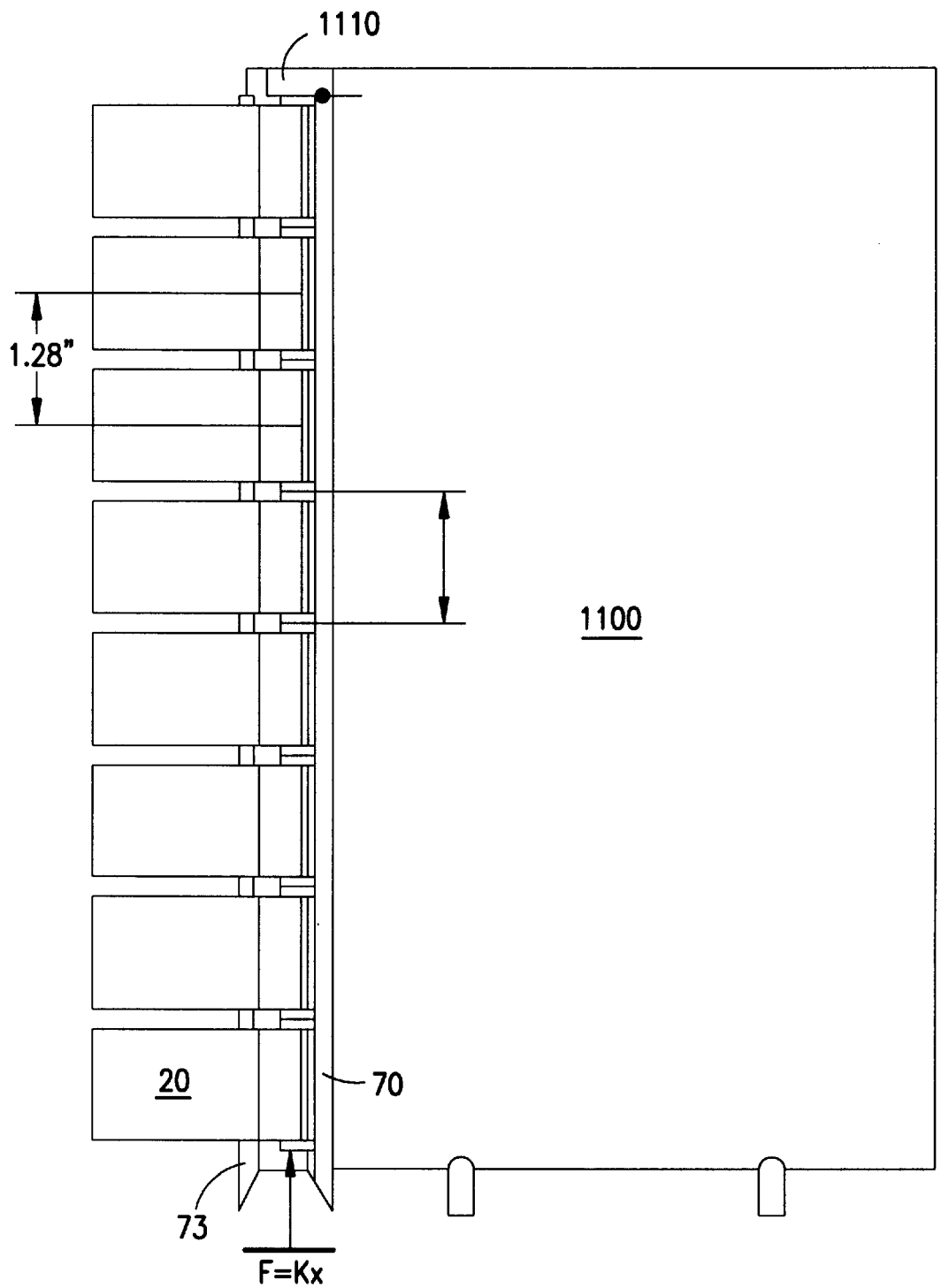
FIG. 14 is a view of the alignment feet of the OIMs within the alignment rail of the typical board 1100.
Figure 15:
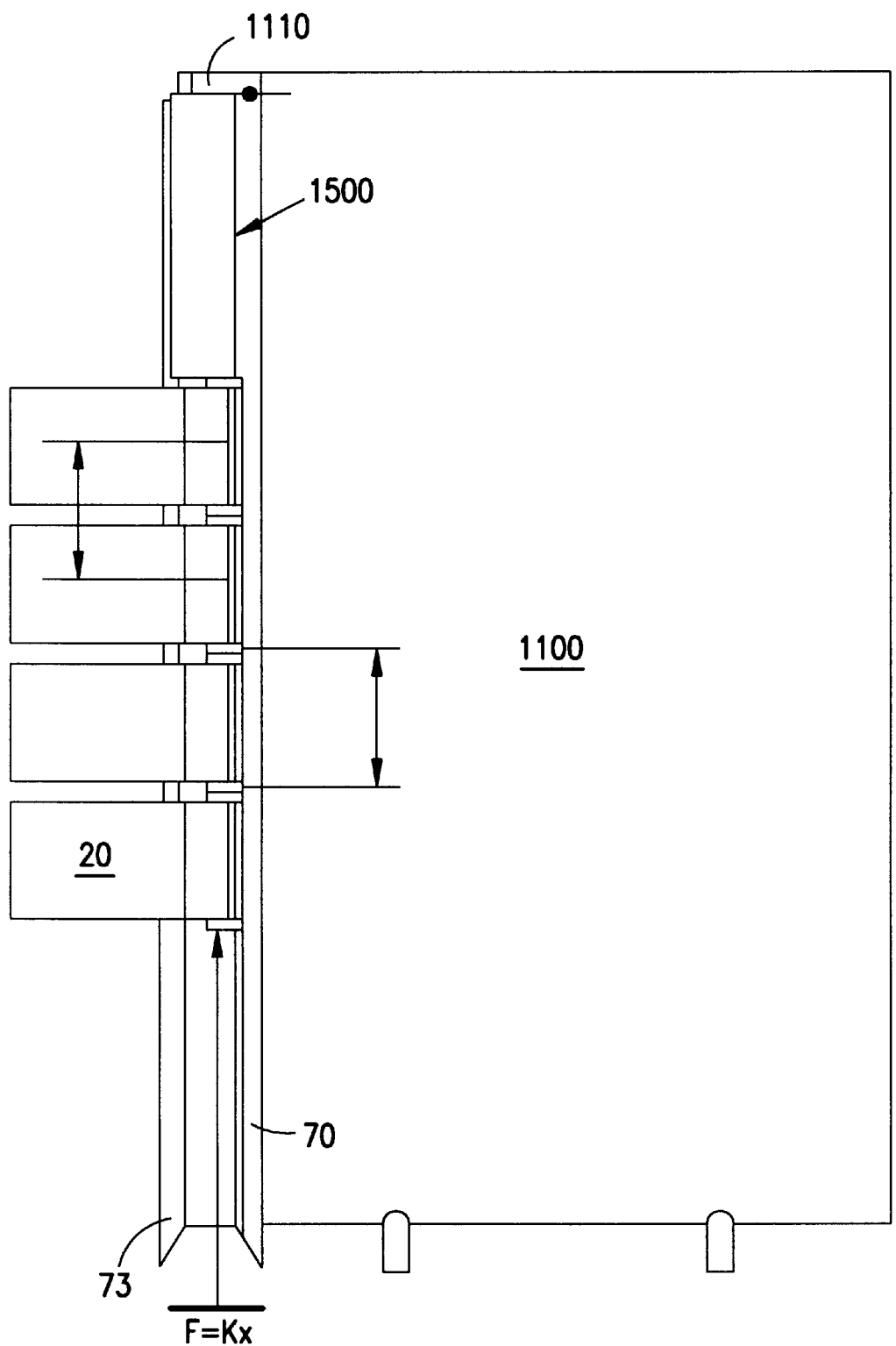
FIG. 15 is a view of the alignment feet of the OIMs and a blank within the alignment rail of the typical board 1100.

FIG. 14 shows a plurality of OIMs within the alignment rails 70 and 73 of a typical board 1100. The inside rail 70 includes an alignment stop 1100. The spring mechanism produces a force equal to the spring constant k times the deflection of the spring X. The spring mechanism is shown schematically as a force which is placed on the last OIM 20. The force acts toward the alignment stop 1100 and reduces the amount of float between the various OIMs in the stack or row. FIG. 15 shows much the same arrangement, however, a reduced number of OIMs now populate the area between the outer rail 73 and the inner rail 70. A snap-fit block or blank 1500 is placed between the alignment stop 1100 and one of the OIMs 20 in the stack. A spring constant force is placed on the bottom of the stack and is shown schematically as a force equal to the spring constant k times the distance of the deflection of the spring.

Prior Art Configuration

Figure 16:
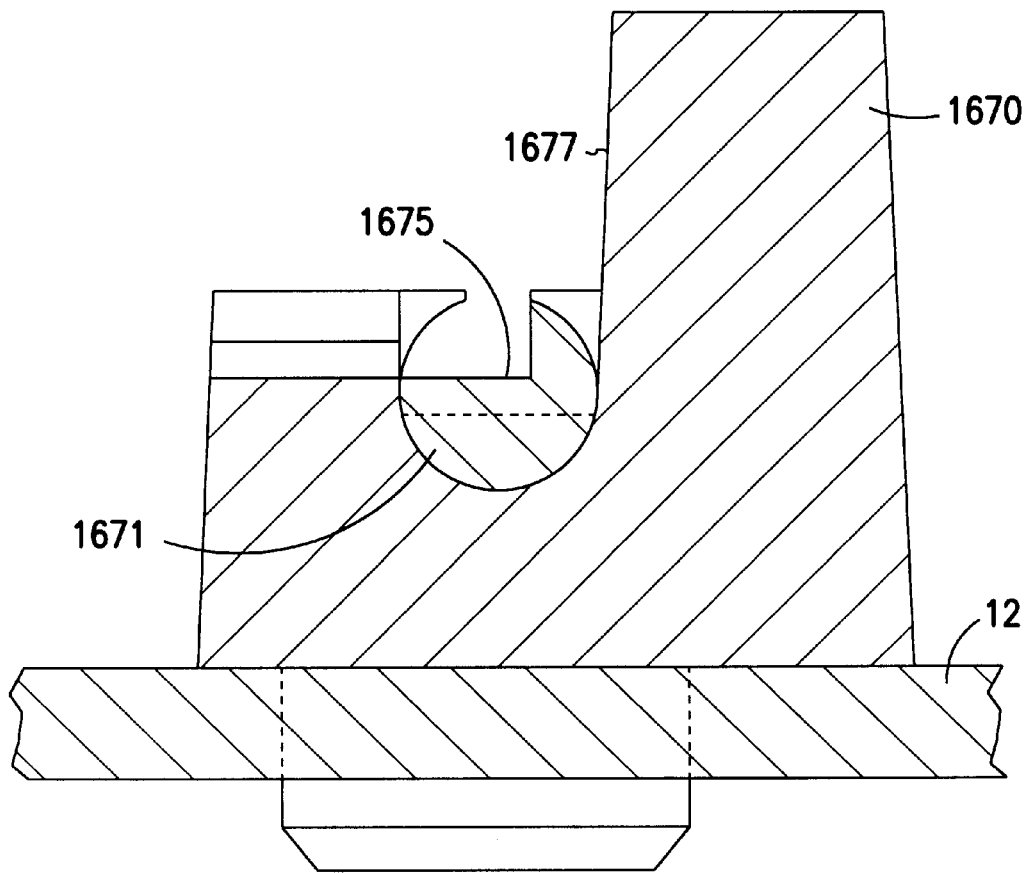
FIG. 16 is a cross-section of the alignment rail of the prior art showing a lock-out mechanism in the locked out position.

The printed circuit board and individual OIM 20 shown in FIG. 16 shows the previous interconnection system which this inventive interconnection system replaces. In the previous interconnection system one of the rails, namely the inner rail 1670, includes a lock-out mechanism. The lock-out mechanism prevents the board rails 1670,73 from aligning with the alignment feet 56 on the first OIM 20 in a given row of OIMs 20. The rails 1670,73 include a lock-out mechanism as shown in FIG. 16, which is shown in a position to allow the feet 56 to cooperate with the slots 72. The lock-out mechanism comprises a mechanical assembly having a rod 1671 formed with slots 1675 which allow the feet 56 to cooperate with the slots 1672 in the board alignment rail 1670. The rod 1671 can also be rotated within the rail 1670 such that the slots 1675 are facing towards the board 12 to prevent the alignment feet 56 from cooperating with the rail slots 1672 because the slots would be filled by the rod 1671 in that configuration. After the board 12 is in position across the row of OIMs 20, the rod 1671 is rotated to expose the slots 1675, allowing the alignment feet 56 to cooperate with the corresponding slots 1672 in the board alignment rails 1670,73, thus assuring proper location of the board pads 82 and flex cable contact bump patterns 64. The board alignment rail 1670 located the farthest in on the board 12 is shown in FIG. 16 and, in addition to the lockout mechanism contained by both rails 70,73 includes a backstop 77 to prevent the board 12 from being pushed too far into the OIM 20. The prior art system discussed above did not include a board having an alignment stop. In addition, the OIM furthest from the alignment stop did not carry a spring or other biasing mechanism biasing the OIMs in the stack or row of OIMs toward the alignment stop.

The above description is intended to illustrate the invention, and not to limit or restrict the scope of the invention. Many other embodiments will be apparent to those skilled in the art upon reviewing the above description. The scope of the invention should therefore be construed with reference to the appended claims, along with the full scope of equivalents to which such claims may be entitled.

What is claimed is:

1. An interconnection system for making electrical contact between a printed circuit board and a set of interconnection modules, said interconnection system comprising:
   a printed circuit board comprising:
      an outer rail positioned near the edge of the printed circuit board;
      an inner rail positioned near the edge of the printed circuit board and positioned near the inner rail to form an alignment space between the inner rail and the outer rail; and
      an alignment stop attached to one end of one of the inner or outer rail; and
   a biasing element positioned at the other end of the inner rail and outer rail, said biasing element biasing the set of interconnection modules toward the alignment stop.

2. The interconnection system of claim 1 wherein the printed circuit board further comprises a plurality of electrical contact points located between the outer rail and the inner rail.

3. The interconnection system of claim 2 wherein one of the inner rail or the outer rail of the printed circuit board includes slots therein for edgewise alignment of the interconnection modules with the contact points.

4. The interconnection system of claim 1 further comprising a blank dimensioned to be substantially the same edgewise dimension as one of the interconnection modules, said blank abutting the alignment stop.

5. The interconnection system of claim 1 further comprising a blank dimensioned to be substantially the same edgewise dimension as a plurality of the interconnection modules, said blank abutting the alignment stop.

6. A printed circuit board adapted for making electrical connection to a set of interconnection modules, said printed circuit board comprising:
   a plurality of electrical components attached to said printed circuit board;
   a plurality of electrical paths from said plurality of electrical components, said electrical paths terminating in electrical contact points;
   a rail positioned near the edge of the printed circuit board, said rail having a first end and a second end; and
   an alignment stop attached to the rail near one of the first end or the second end of the rail.

7. An information handling system comprising:
   a plurality of memory printed circuit boards containing memory modules;
   a plurality of central processing unit printed circuit boards containing microprocessor modules;
   a plurality of other printed circuit boards;
   an interconnection system for electrically connecting the memory printed circuit boards, the central processing unit printed circuit boards, and the other printed circuit boards, said interconnection system further comprising:
      a set of interconnection modules placed adjacent one another to form a substantially aligned row; and
      a printed circuit board comprising:
         an outer rail positioned near the edge of the printed circuit board;
         an inner rail positioned near the edge of the printed circuit board and positioned near the inner rail to form an alignment space between the inner rail and the outer rail; and
         an alignment stop attached to one end of one of the inner or outer rail; and
         a biasing element positioned at the other end of the inner rail and outer rail, said biasing element biasing the set of interconnection modules toward the alignment stop.

8. The information handling system of claim 7 wherein the printed circuit board further comprises a plurality of electrical contact points located proximate the outer rail.

9. The information handling system of claim 8 wherein the outer rail of the printed circuit board includes slots therein for clearance of the interconnection modules with the contact points.

10. The information handling system of claim 7 further comprising a blank dimensioned to be substantially the same edgewise dimension as one of the interconnection modules, said blank abutting the alignment stop.

11. The information handling system of claim 7 further comprising a blank dimensioned to be substantially the same edgewise dimension as a plurality of the interconnection modules, said blank abutting the alignment stop.

12. The information handling system of claim 7 wherein the printed circuit board further comprises an inner rail substantially parallel to the outer rail.

13. The information handling system of claim 12 wherein the printed circuit board further comprises a plurality of electrical contact points located between the outer rail and the inner rail.

14. The information handling system of claim 13 wherein one of the inner rail or the outer rail of the printed circuit board includes a stop therein for edgewise alignment of the interconnection modules with the contact points.

* * * * *